United States Patent [19]

Roggwiller

[11] Patent Number: 4,961,099
[45] Date of Patent: Oct. 2, 1990

[54] HIGH-POWER GTO THYRISTOR AND ALSO A METHOD FOR ITS MANUFACTURE

[75] Inventor: Peter Roggwiller, Riedt-Neerach, Switzerland

[73] Assignee: Asea Brown Boveri Ltd., Baden, Switzerland

[21] Appl. No.: 308,534

[22] Filed: Feb. 10, 1989

[30] Foreign Application Priority Data

Feb. 12, 1988 [CH] Switzerland .......................... 520/88

[51] Int. Cl.$^5$ ............................................ H01L 29/74
[52] U.S. Cl. .................................... 357/38; 357/39
[58] Field of Search ............................... 357/38, 39

[56] References Cited

U.S. PATENT DOCUMENTS

| 4,641,187 | 3/1987 | Sugimoto et al. | 357/52 |
| 4,673,961 | 6/1987 | Nishizawa et al. | 357/38 |
| 4,742,377 | 5/1988 | Einthoven | 357/52 |

FOREIGN PATENT DOCUMENTS

| 0160525 | 11/1985 | European Pat. Off. | 357/38 |
| 3046134 | 6/1982 | Fed. Rep. of Germany | 357/39 |
| 3612367 | 10/1987 | Fed. Rep. of Germany | 357/38 |
| 53-79471 | 7/1978 | Japan | 357/38 P |
| 56-103466 | 8/1981 | Japan | 357/38 |
| 60-189262 | 9/1985 | Japan | 357/38 |
| 55085077 | 6/1986 | Japan | 357/52 |
| 63-198383 | 8/1988 | Japan | 357/52 |
| 8060257 | 4/1981 | United Kingdom | 357/52 |

OTHER PUBLICATIONS

Patent Abstracts of Japan, vol. 7, No. 58, (E-163)(1203), Mar. 10, 1983.

Patent Abstracts of Japan, vol. 7, No. 115, (E-176)(1260), May 19, 1983.

IEEE Transactions on Electron Devices, vol. ED-31, No. 12, Dec. 1984, IEEE (N.Y., U.S.A.) T. Yatsuo et al.

*Primary Examiner*—Rolf Hille
*Assistant Examiner*—Steven Loke
*Attorney, Agent, or Firm*—Oblon, Spivak, McClelland, Maier & Neustadt

[57] ABSTRACT

In a high-power GTO thyristor with anode short-circuits (7) in the anode-side p-type emitter layer (6), the triggering sensitivity is improved by an additional thin and lightly doped p$^-$-type barrier layer (9) between the anode short-circuits (7) and the n-type base layer (5) without the turn-off process being negatively affected.

5 Claims, 2 Drawing Sheets

HIGH-POWER GTO THYRISTOR AND ALSO A METHOD FOR ITS MANUFACTURE

BACKGROUND OF THE INVENTION

1. Field of the Invention

The present invention relates to the field of power semiconductor components. It relates, in particular, to a high-power GTO thyristor having an anode and a cathode, comprising
- a layer sequence comprising an n-type emitter layer and a p-type base layer, an n-type base layer and a p-type emitter layer between the cathode and the anode in a semiconductor substrate;
- the p-type emitter layer being perforated by anode short-circuits, which anode short-circuits short-circuit the n-type base layer to the anode.

The invention further relates to a process for manufacturing a high-power GTO thyristor.

A high-power GTO thyristor of the type mentioned in the introduction is known, for example, from EP-A2-0,160,525.

DISCUSSION OF BACKGROUND

High-power GTO thyristors with this type of construction can be used to turn off load currents of several thousand amperes by means of a negative gate current and to disconnect voltages of up to 5 kV.

In order to minimize the losses, which occur mainly during the turn-off operation, and at the same time to ensure as high a turn-off gain (ratio between current turned off and maximum gate current) as possible, special measures have to be taken in the design and the manufacture of such components.

The object of such measures is, on the one hand, to keep the injection of free charge carriers in the conducting state as low as possible and, on the other hand, to increase their rate of removal on turn-off.

Two different methods (often also in combination) are used for this purpose (see EP-A2-0,160,525):

(a) Partial short-circuiting of the anode-side p+-type emitter by interlacing p+-doped with n+-doped zones (anode short-circuits). On the one hand, the efficiency of the anode emitter is thereby reduced and, on the other hand, majority carriers are able to drain via the n+-type short-circuits during turn-off.

(b) Reduction of the minority carrier lifetime by incorporating recombination centres, for example, by means of irradiation with high-energy particles or photons or drive-in of heavy-metal atoms (gold). This also achieves a reduction of the level of injection of the excess charge carriers during turn-off.

In addition to the required effects, however, both measures also result in unfavorable effects on the electrical behavior of the GTO thyristor: namely in both cases the gain of the pnp sub-transistor in the thyristor is reduced, and this results, in particular, in the impairment of the triggering sensitivity of the thyristor.

This effect becomes particularly serious in structures with a considerable "shorting" of the anode emitter since it is particularly at low currents, such as those which flow at the beginning of the switch-on operation, that the emitter efficiency is considerably reduced.

On the other hand, it is expedient to completely dispense with the anode short-circuits (shorts) in favor of reducing the charge carrier lifetime only in component structures for low disconnection voltages (less than 2 kV) since the on-state voltages would become disproportionately large for correspondingly thicker components (for high disconnection voltages).

SUMMARY OF THE INVENTION

Accordingly, one object of this invention is to provide a high-power GTO thyristor with anode short-circuits which has an improved triggering sensitivity, without loosing the positive effect of the anode short-circuits on the turn-off behaviour.

The object is achieved in a high-power GTO thyristor of the type mentioned in the introduction, wherein a $p^-$-type barrier layer is disposed at least inside the region carrying the on-state current, between the anode short-circuits and the n-type base layer.

The essence of the invention is therefore to use means in the thyristor which raise the short-circuit action for low current densities (triggering) as much as possible, with the latter remaining effective at high currents (turn-off).

The lightly p-doped $p^-$-type barrier layer in front of the anode short-circuits ($n^+$-doped) is such a means. At the beginning of the switch-on operation, i.e. with an injection in the n-type base layer which is less than the doping concentration of the barrier layer, it prevents electrons from being able to drain directly to the anode. Or expressed in other words, the $p^-$-type barrier layer produces a high efficiency of the p-type emitter which equals that without anode short-circuits.

In the on-state of the GTO thyristor and during the turn-off operation, the $p^-$-type barrier layer is completely flooded with charge carriers and consequently, virtually inoperative.

In order that the short-circuit action is maintained during turn-off down to as low an injection level as possible, the $p^-$-type barrier layer preferably has a doping concentration of less than $10^{15} cm^{-3}$.

It is furthermore advantageous to form the $p^-$-type barrier layer with a thickness of only a few micrometers in order to ensure a high efficiency of the $p^+$-type emitter at low current densities.

The method according to the invention is notable for the fact that the dopant deposition necessary to produce the $p^-$-type barrier layer is introduced into the semiconductor substrate by means of ion implantation.

This has the advantage that the required low dopant concentrations can easily be established with the necessary homogeneity and precision.

Further exemplary embodiments of the invention emerge from the subclaims.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENT

As a rule, in a high-power GTO thyristor, a multilicity of individual thyristor elements or cells are isposed next to each other on a large-area semiconductor substrate (or wafer).

Figure 1:
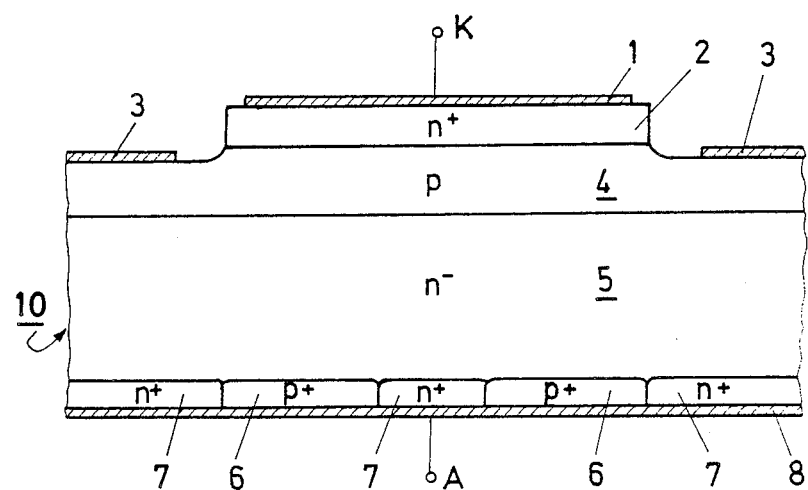
FIG. 1 shows, in cross section, the structure of an individual cell of a conventional GTO thyristor with anode short-circuits.

Referring now to the drawings, wherein like reference numerals designate identical or corresponding parts throughout the several views, FIG. 1 shows the cross section through such an individual thyristor cell for a conventional GTO thyristor with anode short-circuits.

A sequence of variously doped layers which comprises an n-type emitter layer 2 (usually $n^+$-doped), a p-type base layer 4 (usually p-doped) an n-type base layer 5 (usually $n^-$-doped) and a p-type emitter layer 6 (usually $p^+$-doped) is accommodated in the semiconductor substrate 10 between an anode A and a cathode K.

The p-type emitter layer 6 is perforated by dispersedly disposed anode short-circuits 7 (usually $n^+$-doped) which short-circuit the n-type base layer 5 to the anode A (or an anode metalization 8 which is deposited on the anode side on the semiconductor substrate 10).

On the cathode side, contact is made to the n-type emitter layer 2 and the p-type base layer 4 by suitable metallisations, namely a cathode metallization 1 and a gate metallization 3.

Figure 2:
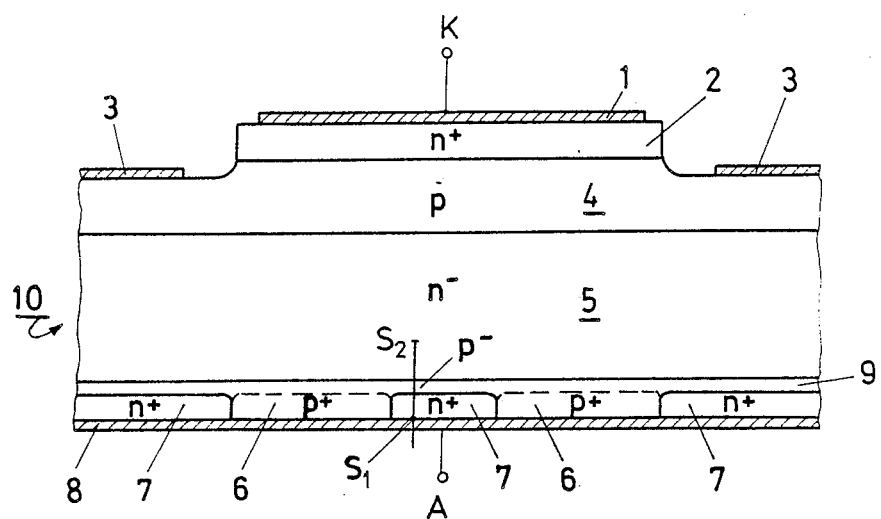
FIG. 2 shows, in a representation corresponding to FIG. 1, the cross section through an individual cell of a GTO thyristor according to an exemplary embodiment of the invention.

Starting from the conventional structure, the representation of FIG. 2 is achieved by incorporating in accordance with the invention an additional $p^-$-type barrier layer 9.

In the exemplary embodiment of FIG. 2, the $p^-$-doped $p^-$-type barrier layer 9, which is only a few micrometers thick, extends laterally not only over the regions of the anode short-circuits 7, but also over the regions of the p-type emitter layer 6. This is possible because the $p^-$-type barrier layer does not have any influence in the region of the p-type emitter layer.

In this way, it is possible to incorporate the $p^-$-type barrier layer without a mask, i.e. particularly simply, in the semiconductor substrate.

Compared with the conventional structure in FIG. 1, a GTO thyristor with the additional $p^-$-type barrier layer 9 in front of the anode short-circuits 7 has an increased blocking voltage in the reverse direction. Should this effect be undesirable, the $p^-$-type layer can be omitted locally, i.e. outside the regions carrying the on-state current.

Figure 3A:
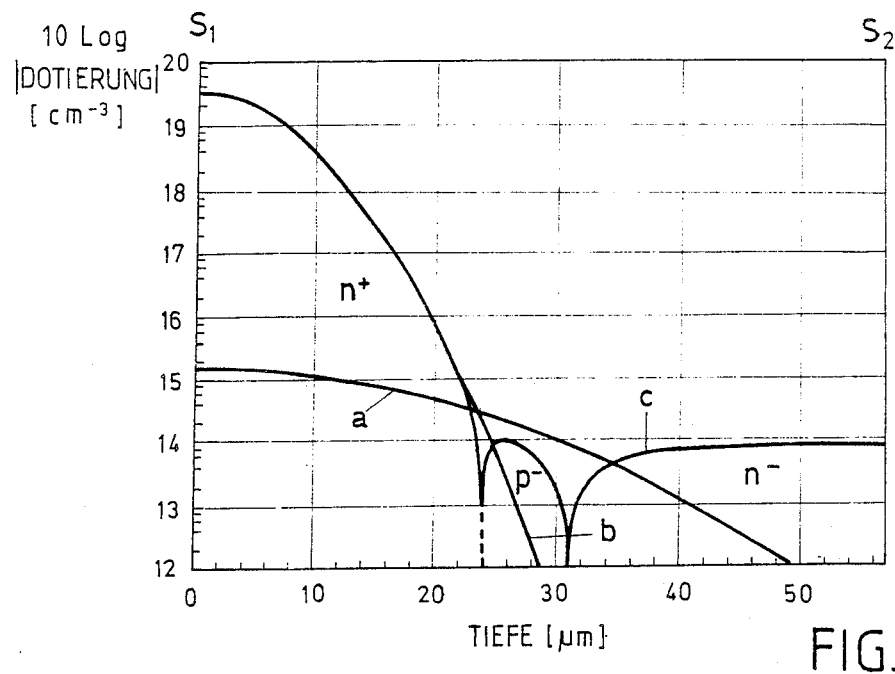
FIG. 3A shows the calculated variation of the doping concentration along the plane of section $S_1-S_2$ in FIG. 2.
Figure 3B:
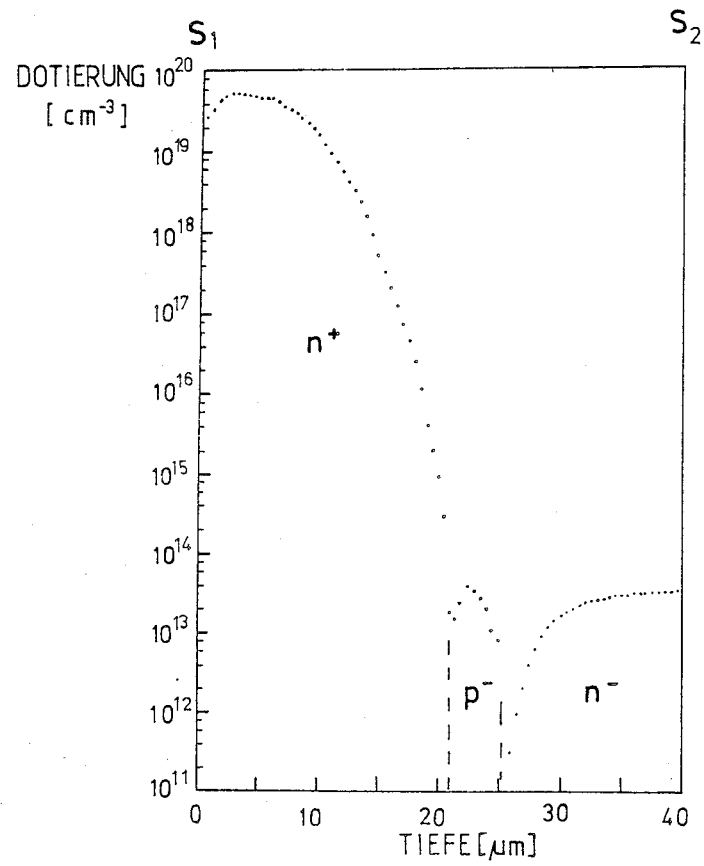
FIG. 3B shows a variation in concentration corresponding to FIG. 3A such as was measured on a practically tested component.

FIG. 3A (calculated) and FIG. 3B (measured) show the variation of the doping concentration in a GTO thyristor, according to FIG. 2 along the plane of section through the points of section $S_1$ and $S_2$ shown therein.

The variation in concentration (curve c in FIG. 3A) is made up of the basic $n^-$-doping of the semiconductor substrate (approximately $10^{14}$ cm$^{-3}$ in the righthand part of the Figure) and the $p^-$-dopings (curve a) and $n^+$-dopings (curve b) additionally introduced there from the anode side.

As can readily be seen, the $p^-$-type barrier layer has a maximum doping concentration in the calculated variation (FIG. 3A) of approximately $10^{14}$ cm$^{-3}$ and a thickness of about 7 micrometers.

Similar conditions are actually achieved in components which have been constructed, as is shown by the "spreading resistance" measurement in FIG. 3B. Here the concentration in the $p^-$-type barrier layer is approximately $4 \times 10^{13}$ cm$^{-3}$ and its thickness is approximately 4 micrometers.

The dopant deposition for this $p^-$-type barrier layer is carried out for this purpose by ion implantation since the required low concentrations can thereby readily be established with the necessary homogeneity.

Initial experimental studies on 600 A GTO thyristors have shown that the minimum triggering current can be reduced by at least a factor of 5 at room temperature with the structure according to the invention without appreciably affecting the switch-off behaviour.

The invention therefore makes it possible to avoid, in high-power GTO thyristors, the unfavourable effect of anode short-circuits on their switch-on behaviour.

Obviously numerous modifications and variations of the present invention are possible in the light of the above teachings. It is therefore to be understood that within the scope of the appended claims the invention may be practiced otherwise than as specifically described herein.

What is claimed as new and desired to be secure by Letters Patent of the United States is:

1. High-power GTO thyristor having a cathode and an anode, comprising:
   a layer sequence comprising an n-type emitter layer, a p-type base layer, an n-type base layer and a p-type emitter layer between the cathode and the anode in a semiconductor substrate;
   the p-type emitter layer being perforated by anode short-circuits, which anode short-circuits short-circuit the n-type base layer to the anode;
   wherein:
   a $p^-$-type barrier layer is disposed at least inside a region carrying an on-state current between the anode short-circuits and the n-type base layer;
   said $p^-$-type barrier layer has a doping concentration of less than $10^{15}$cm$^{-3}$.

2. High-power GTO thyristor having a cathode and an anode, comprising:
   a layer sequency comprising an n-type emitter layer, a p-type base layer, an n-type base layer and a p-type emitter layer between the cathode and the anode in a semiconductor substrate;
   the p-type emitter layer being perforated by anode short-circuits, which anode short-circuits short-circuit the n-type base layer to the anode;
   wherein:
   a $p^-$-type barrier layer is disposed at least inside a region carrying an on-state current between the anode short-circuits and the n-type base layer;
   said $p^{31}$-type barrier layer has a doping concentration of less than $10^{15}$cm$^{31\ 3}$ and a thickness of 7 $\mu$m or less.

3. The GTO thyristor as claimed in claim 2 wherein the $p^{31}$-type barrier layer extends laterally over the entire area of the thyristor.

4. The GTO thyristor as claimed in claim 2, wherein the p-type barrier layer is restricted laterally to the region carrying the on-state current.

5. High-power GTO thyristor having a cathode and an anode, comprising:
   a layer sequence comprising an n-type emitter layer, a p-type base layer, an n-type base layer and a p-type emitter layer between the cathode and the anode in a semiconductor substrate;

the p-type emitter layer being perforated by anode short-circuits, which anode short-circuits short-circuit the n-type base layer to the anode;

wherein:

a p$^-$-type barrier layer is disposed at least inside the region carrying the on-state current between the anode short-circuits and the n-type base layer;

said p$^-$-type barrier layer has a doping concentration of approximately $10^{14} cm^{-3}$ or less and a thickness of 7μm or less.

* * * * *